United States Patent
Kao et al.

(10) Patent No.: US 12,148,691 B2
(45) Date of Patent: Nov. 19, 2024

(54) THREE-DIMENSIONAL INTEGRATED STRUCTURE AND MANUFACTURING METHOD THEREOF

(71) Applicant: Taiwan Semiconductor Manufacturing Company, Ltd., Hsinchu (TW)

(72) Inventors: Yun-Feng Kao, New Taipei (TW); Chien-Hao Huang, Hsinchu (TW); Gao-Ming Wu, New Taipei (TW); Katherine H Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 98 days.

(21) Appl. No.: 17/704,026

(22) Filed: Mar. 25, 2022

(65) Prior Publication Data

US 2023/0307351 A1    Sep. 28, 2023

(51) Int. Cl.
*H01L 23/522* (2006.01)
*H01L 49/02* (2006.01)
*H10B 12/00* (2023.01)

(52) U.S. Cl.
CPC .......... *H01L 23/5223* (2013.01); *H01L 28/90* (2013.01); *H10B 12/033* (2023.02); *H10B 12/31* (2023.02)

(58) Field of Classification Search
CPC ..... H01L 23/5223; H01L 28/60; H01L 28/90; H01L 28/91; H10B 12/033; H10B 12/31
See application file for complete search history.

(56) References Cited

U.S. PATENT DOCUMENTS

| | | | |
|---|---|---|---|
| 2012/0061798 A1* | 3/2012 | Wong | H01L 28/40 257/532 |
| 2015/0145103 A1* | 5/2015 | Chou | H01L 28/60 438/387 |
| 2017/0213896 A1* | 7/2017 | Lisiansky | H01L 23/5223 |
| 2019/0035674 A1* | 1/2019 | Chiu | H01L 28/92 |
| 2019/0229053 A1* | 7/2019 | Hung | H01L 23/5223 |

\* cited by examiner

*Primary Examiner* — Omar F Mojaddedi
(74) *Attorney, Agent, or Firm* — JCIPRNET

(57) ABSTRACT

A three-dimensional integrated structure and the manufacturing method(s) thereof are described. The three-dimensional integrated structure includes a substrate having conductive features therein, and a component array disposed over the substrate and on the conductive features. The component array includes a metallic material layer and capacitor structures separated by the metallic material layer. Each of the capacitor structures includes a first metallic pillar, a first dielectric sheath surrounding the first metallic pillar, a second metallic sheath surrounding the first dielectric sheath, and a second dielectric sleeve surrounding the second metallic sheath. The metallic material layer laterally encapsulates the capacitor structures.

20 Claims, 17 Drawing Sheets

THREE-DIMENSIONAL INTEGRATED STRUCTURE AND MANUFACTURING METHOD THEREOF

BACKGROUND

Three-dimensional integration is one practical approach to achieve high-density integration of diverse components such as microprocessors, memory, optoelectronics, mixed signal circuits and passive electronic components at the wafer level.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4' is a schematic cross-sectional view of one exemplary intermediate structure of a three-dimensional integrated structure according to some embodiments of the present disclosure.

FIG. 6' is a schematic perspective view of one exemplary intermediate structure of a three-dimensional integrated structure according to some embodiments of the present disclosure.

DETAILED DESCRIPTION

Figure 1:
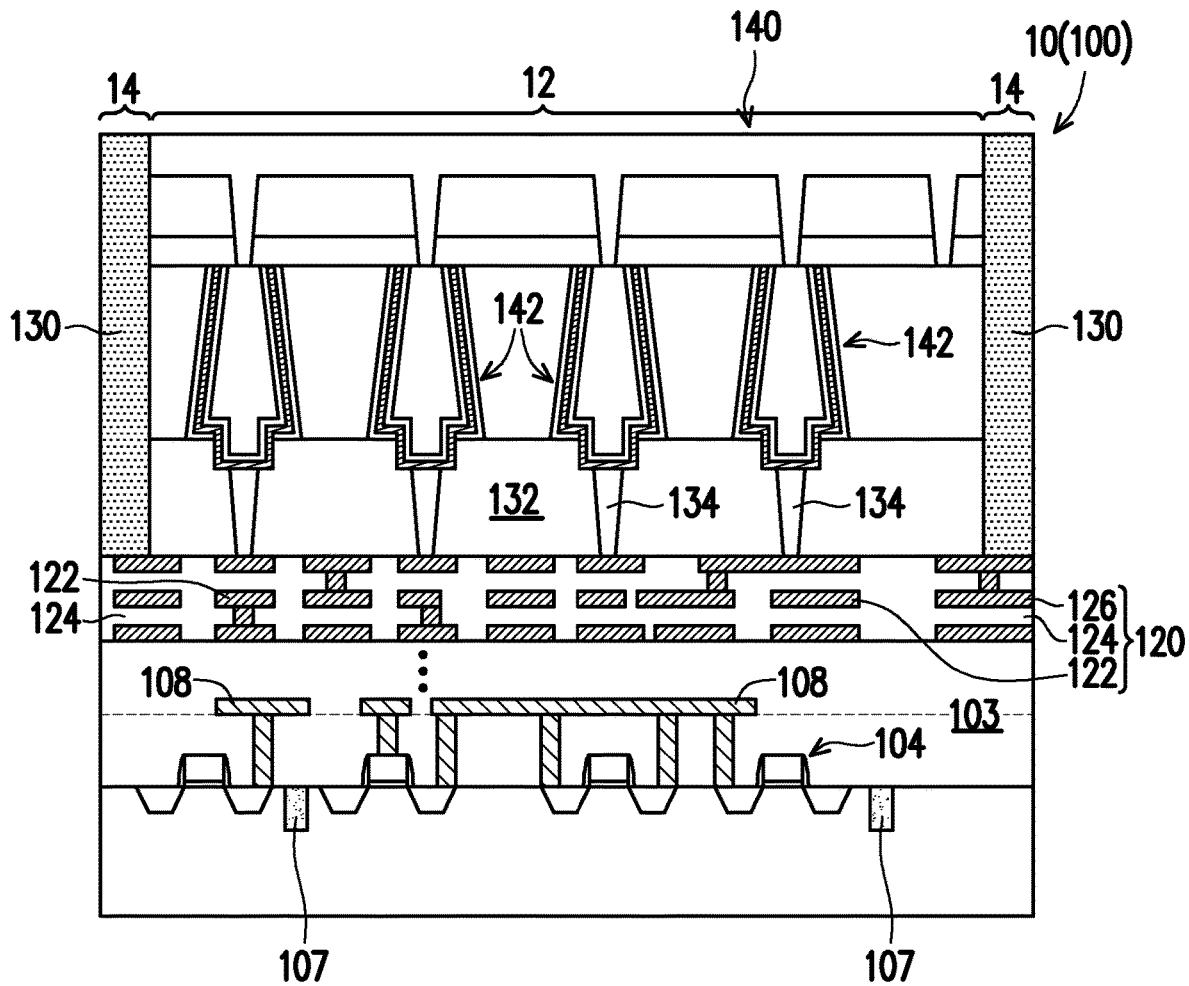
FIG. 1 is a schematic cross-sectional view of a portion of an exemplary three-dimensional integrated structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The specific embodiment(s) discussed herein is merely illustrative and is related to a three-dimensional (3D) integration structure or stacking assembly, and does not limit the scope of the present disclosure. Embodiments of the present disclosure describe the exemplary manufacturing process of 3D integration structures and the 3D integration structures fabricated there-from. Certain embodiments of the present disclosure are related to 3D structures formed with passive electronic components. Other embodiments relate to 3D integration structures or assemblies including capacitors with other electrically connected components in the form of dies or wafers, and the wafers or dies may further include one or more types of integrated circuits or electrical components on a bulk semiconductor substrate or a silicon/germanium-on-insulator substrate. The embodiments are intended to provide further explanations but are not used to limit the scope of the present disclosure.

FIG. 1 illustrates a cross-sectional view of a portion of an exemplary 3D integration structure in accordance with some embodiments of the present disclosure. In FIG. 1, in some embodiments, the 3D integration structure 10 may include or be a wafer 100 or a die comprising a semiconductor substrate 102, semiconductor devices 104 formed on the semiconductor substrate 102, isolation structures 107 formed in the semiconductor substrate 102 and metallization structures 108 formed above and connected with the semiconductor devices 104. In some embodiments, the wafer 100 is a bulk wafer having a plurality of dies, and the 3D integration structure 10 is shown as a portion of the wafer 100. In certain embodiments, the semiconductor devices 104 are formed in the semiconductor wafer 100 during the front-end-of-line (FEOL) processes. In certain embodiments, the wafer 100 is a semiconductor wafer made of silicon or other semiconductor materials, such as III-V semiconductor materials. In some embodiments, the semiconductor substrate 102 may include elementary semiconductor materials such as silicon or germanium, compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In exemplary embodiments, the semiconductor device 104 such as transistors are covered by an insulation layer 103 and some semiconductor devices 104 are electrically isolated through the isolation structures 107. In some embodiments, the semiconductor devices 104 are transistors, memories or power devices. It is understood that the semiconductor devices 104 shown in FIG. 1 are merely examples, and other types of devices may be formed in the wafer 100. In some embodiments, the semiconductor devices 104 may include one or more dopant-types of devices.

As shown in FIG. 1, in certain embodiments, the metallization structures 108 are embedded within the insulation layer 103 and formed over the semiconductor devices 104.

In some embodiments, the insulation layer 103 includes one or more dielectric layers. In some embodiments, a material of the insulation layer 103 includes silicon oxide, a spin-on dielectric material, a low-k dielectric material or a combination thereof. The formation of the insulation layer 103 includes performing one or more processes by chemical vapor deposition (CVD) or by spin-on, for example. In some embodiments, the metallization structures 108 include interconnecting structures, such as metal lines, via and contact plugs. In certain embodiments, the materials of the metallization structures 108 include aluminum (Al), copper (Cu), nickel (Ni), titanium (Ti), tungsten (W), alloys or combinations thereof. In exemplary embodiments, the semiconductor devices 104 are electrically connected with the metallization structures 108 and some of the semiconductor devices 104 are electrically interconnected through the metallization structures 108. The metallization structures 108 shown herein are merely for illustrative purposes, and the metallization structures 108 may include other configurations and may include one or more through vias and/or damascene structures.

As shown in FIG. 1, in some embodiments, an interconnection structure 120 is formed over the insulation layer 103 and the metallization structures 108. In exemplary embodiments, the interconnection structure 120 includes conductive features 122 embedded in a dielectric material 124. In some embodiments, the conductive features 122 may include routing traces, vias and pads. In some embodiments, the interconnection structure 120 may further include reinforcing elements 126 such as seal ring structures, for example. In exemplary embodiments, the 3D integration structure 10 includes bulk isolation structures 130 located in the parting region 14 and defining a component region 12 where one or more component arrays are formed therein. In some embodiments, the bulk isolation structures 130 are located right on the reinforcing elements 126. In some embodiments, the component region 12 includes a device region of the wafer 100. In some embodiments, a component array 140 is formed over an insulation layer 132 inside the component region 12. In some embodiments, the component array 140 includes capacitors 142 set on the insulation layer 132, and the capacitors 142 are electrically connected with the underlying interconnection structure 120 through the conductive through vias 134 penetrating through the insulation layer 132. In some embodiments, other devices such as resistors, diodes, photo-diodes, sensors or fuses may be formed within the component region 12. Although not expressly shown in FIG. 1, some of the conductive features 122 are electrically interconnected to one another and some of the conductive features 122 are electrically connected with the underlying metallization structures 108 and/or the semiconductor devices 104. In exemplary embodiments, some or all the semiconductor devices 104 are electrically connected with the capacitors 142 through the conductive through vias 134, the interconnection structure 120 and the metallization structures 108.

In exemplary embodiments, the conductive features 122 and the conductive through vias 134 are made of metal or metallic materials, such as Cu, Al, Ni, Ti, W, cobalt (Co), tantalum (Ta), alloys or combinations thereof. In some embodiments, a diffusion barrier layer (not shown) may be formed between the insulation layer and the conductive features and/or through vias. In some embodiments, the material of the insulation layer 132 may include silicon oxide, silicon nitride, benzocyclobutene (BCB), epoxy, polyimide (PI), or polybenzoxazole (PBO).

Figure 2:
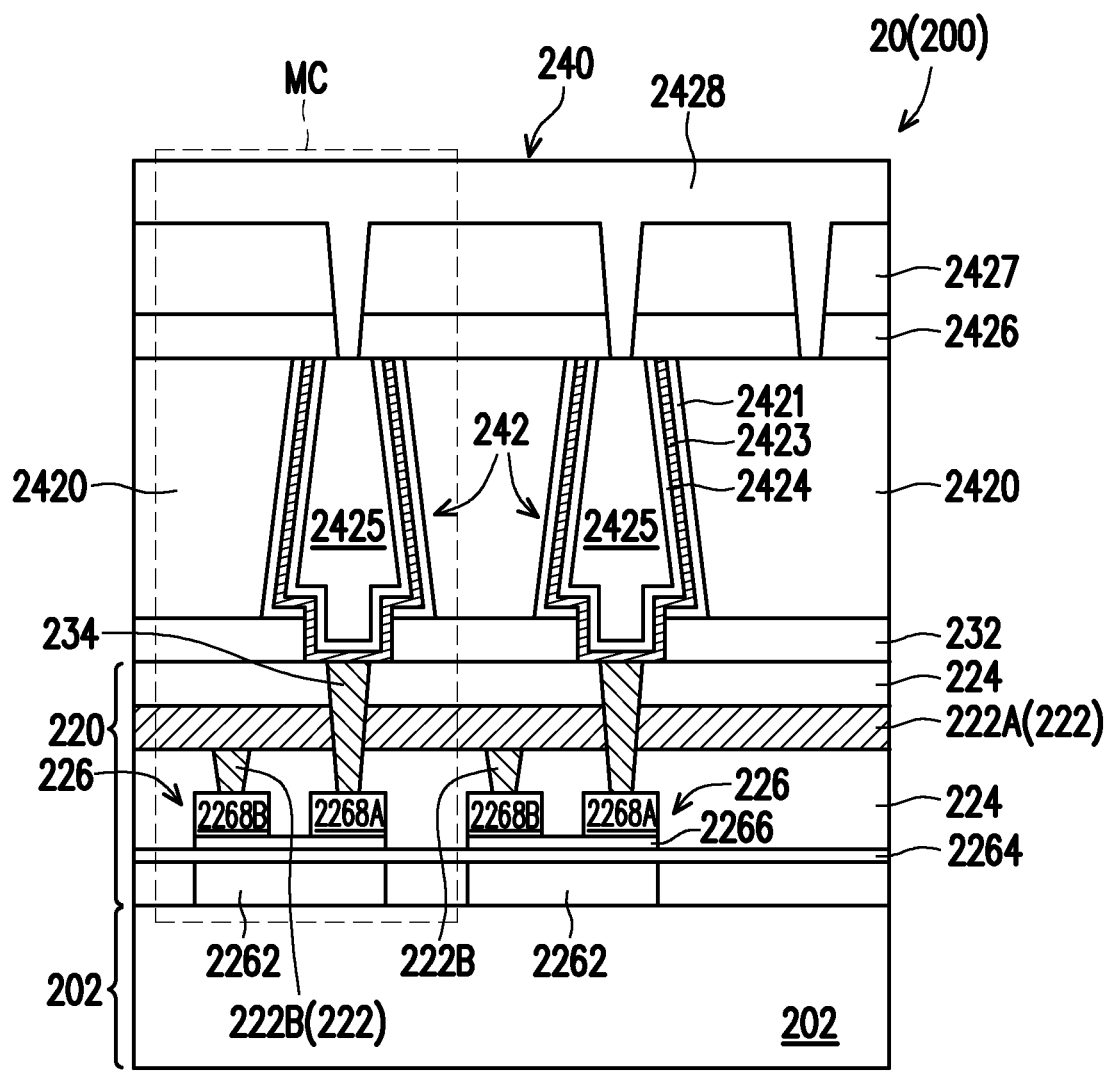
FIG. 2 is a schematic cross-sectional view of a portion of an exemplary three-dimensional integrated structure in accordance with some embodiments of the present disclosure.

FIG. 2 is a perspective view of a portion of an exemplary three-dimensional integrated structure in accordance with some embodiments of the present disclosure. In FIG. 2, in some embodiments, the 3D integrated structure 20 may include or be a wafer or a die 200 comprising a semiconductor substrate 202. In exemplary embodiments, the semiconductor substrate 202 of FIG. 2 is similar to the above described semiconductor substrate 102 and may further includes semiconductor devices, isolation structures and metallization structures formed therein. In some embodiments, as seen in FIG. 2, an interconnection structure 220 is formed over the semiconductor substrate 202, and an insulation layer 232 is formed over the interconnection structure 220. In exemplary embodiments, the interconnection structure 220 includes conductive feature(s) 222 embedded in a dielectric material 224. In some embodiments, the conductive feature(s) 222 may include routing traces, connection lines, vias and pads, and the dielectric material 224 may include two or more dielectric layers or layers of different dielectric materials.

As seen in FIG. 2, at least one conductive feature 222 functioning as a bit line 222A is shown as an example, but more conductive features may be included within the interconnection structure 220. In some embodiments, the interconnection structure 220 may further include isolation structures and/or structural reinforcing elements if needed, and multiple levels of interconnection structures may be formed for electrical connection and interconnection. In some embodiments, more than one semiconductor devices 226 are formed in the interconnection structure 220. In certain embodiments, the semiconductor devices 226 are formed within the interconnection structure 220 (i.e. at the same level of the interconnection structure 220). In some embodiments, the semiconductor devices 226 are formed along with the interconnection structure 220 during the back-end-of-line (BEOL) processes.

In exemplary embodiments, one semiconductor device 226 includes a stack structure of a gate 2262, a gate dielectric layer 2264 and a semiconductor layer 2266 sequentially stacked from the bottom to the top, and the semiconductor device 226 also includes a source terminal 2268A and a drain terminal 2268B located directly on the semiconductor layer 2266 of the stack structure, and the source terminal 2268A and the drain terminal 2268B are separate from each other by the dielectric material 224 located there-between. In one embodiment, the semiconductor devices 226 share a common gate dielectric layer 2264. In some embodiments, the semiconductor device(s) 226 comprises active devices such as thin film transistors (TFTs), field effect transistors (such as MOSFETs or planar or fin-type FETs), nanosheet transistors or gate-all around (GAA) transistors, high voltage transistors, and/or other suitable components. It is understood that the semiconductor devices 226 shown in FIG. 2 are merely examples, and other types of devices may be incorporated.

In some embodiments, the gate 2262 includes one or more layers of metallic materials, and each of the source terminal 2268A and the drain terminal 2268B includes one or more layers of metallic materials. In some embodiments, the metallic materials may include aluminum (Al), titanium (Ti), tungsten (W), tantalum (Ta), ruthenium (Ru), molybdenum (Mo), nitride thereof, combinations thereof, and/or alloys thereof. In exemplary embodiments, the gate 2262 includes one or more stacked layers of TiN, TaN, W or TiAl, and either or each of the source terminal 2268A and the drain terminal 2268B includes a titanium nitride barrier layer and a tungsten contact. In some embodiments, the semiconductor layer 2266 includes one or more of semiconductor materials from indium zinc oxide (IZO), indium tin oxide (ITO), gallium oxide (such as $Ga_2O_3$), indium oxide (such as $In_2O_3$), titanium oxide (TiOx), zinc oxide, indium gallium zinc oxide (IGZO), aluminum zinc oxide (AZO, such as $Al_2O_5Zn_2$), and indium tungsten oxide (IWO), or combinations thereof. In some embodiments, the gate dielectric layer 2264 includes silicon oxide. In some embodiments, the gate dielectric layer 2264 includes one or more high-k dielectric materials selected from hafnium oxide, tantalum oxide, titanium oxide and zirconium oxide. The semiconductor device(s) 226 may form an integrated circuit or portion thereof.

In some embodiments, an insulation layer 232 is formed on the dielectric material 224 and a component array 240 is formed over the insulation layer 232. In some embodiments, the component array 240 includes capacitors 242 set on the insulation layer 232, and the capacitors 242 are electrically connected with the underlying semiconductor devices 226 by the conductive through vias 234 penetrating through interconnection structure 220 and connected to the source terminal(s) 2268A of the semiconductor device(s) 226. In some embodiments, the drain terminal(s) 2268B of the semiconductor device(s) 226 are electrically connected to the bit line 222A by the conductive via(s) 222B of the interconnection structure 220. As shown in FIG. 2, the underlying semiconductor device 226 electrically connected with the above capacitor 242 may be regard as a memory cell unit structure MC having one transistor and one capacitor (1T1C). In exemplary embodiments, some or all the semiconductor devices 226 are electrically connected with the capacitors 242 through the conductive through vias 234 and the conductive vias 222B of the interconnection structure 220.

In some embodiments, the component array 240 includes electrode pillars 2425, inner dielectric layers 2424 surrounding the inner electrode pillars 2425, middle electrode layers 2423 surrounding the dielectric layers 2424, outer dielectric layers 2421 surrounding the electrode layers 2423 and an outer electrode layer 2420 wrapping around the outer dielectric layers 2421. As seen in FIG. 2, the electrode pillar 2425 and the three-layered structure of the dielectric layer 2424/electrode layer 2423/dielectric layer 2421 conformally covering the electrode pillar 2425 form a pillar shaped capacitor structure. In some embodiments, the component array 240 also includes a stack of a lower insulating layer 2426 and an upper insulating layer 2427 and a top electrode layer 2428 that is disposed on the upper insulating layer 2427 and penetrates through the stack to be connected with the electrode pillars 2425 and the outer electrode layer 2420. In some embodiments, the electrode pillars 2425 and the outer electrode layer 2420 are electrically connected through the top electrode layer 2428. In some embodiments, the middle electrode layers 2423 respectively are electrically connected with the underlying semiconductor device 226 by the conductive through vias 234.

The construction and arrangements of the component array 240 provide pillar shaped capacitors fully supported by the surrounding common outer electrode layer 2420. By way of such design, the pillar shaped capacitors of high aspect ratios can be formed to provide large capacitance. Also, the adjoining contiguous electrode layer 2420 well supports the pillar shaped capacitor structures to prevent leaning or collapsing issue for capacitors of high aspect ratios.

FIGS. 3-16 are the perspective views showing a three-dimensional integrated structure at various stages of the manufacturing method for forming the three-dimensional integrated structure according to some embodiments of the present disclosure. From FIG. 3 through FIG. 16, schematic perspective views of a component region of the integrated structure are shown. FIG. 4' is a schematic cross-sectional view of one exemplary intermediate structure of a three-dimensional integrated structure according to some embodiments of the present disclosure. FIG. 6' is a schematic perspective view of one exemplary intermediate structure of a three-dimensional integrated structure according to some embodiments of the present disclosure. FIG. 17 is a schematic cross-sectional view showing a portion of the three-dimensional integrated structure fabricated following the manufacturing method in accordance with some embodiments of the disclosure.

Figure 3:
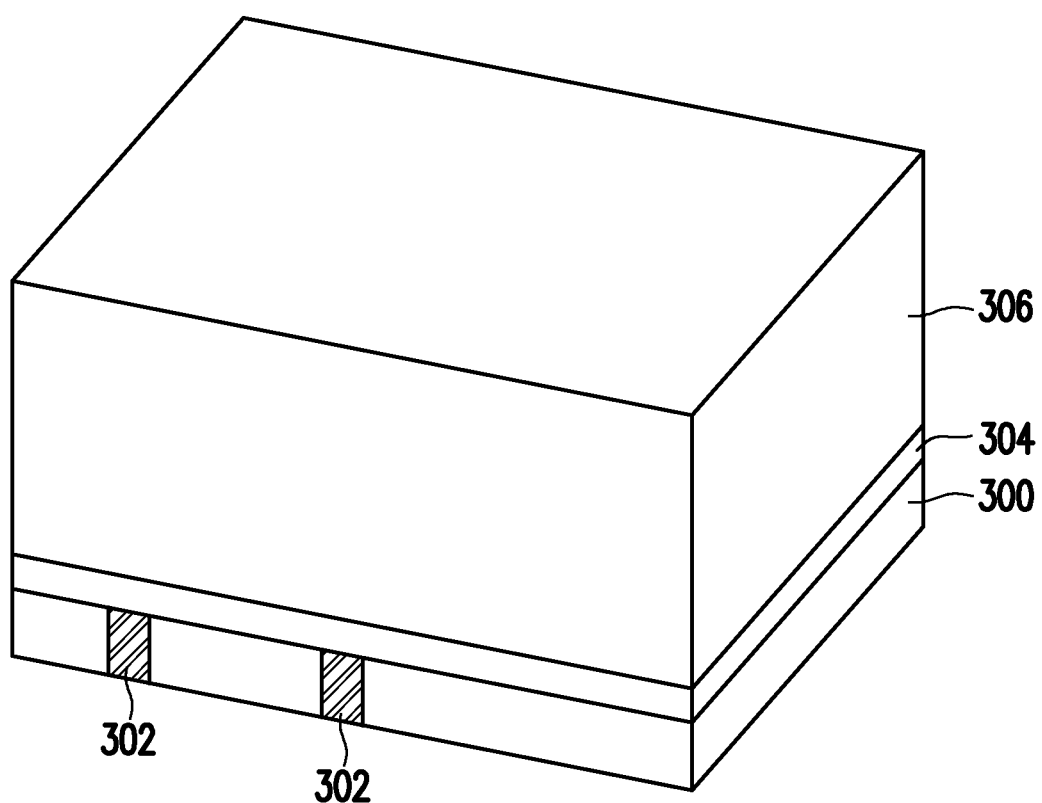
FIGS. 3-16 are the perspective views showing a three-dimensional integrated structure at various stages of the manufacturing method for forming the three-dimensional integrated structure according to some embodiments of the present disclosure.
Figure 4:
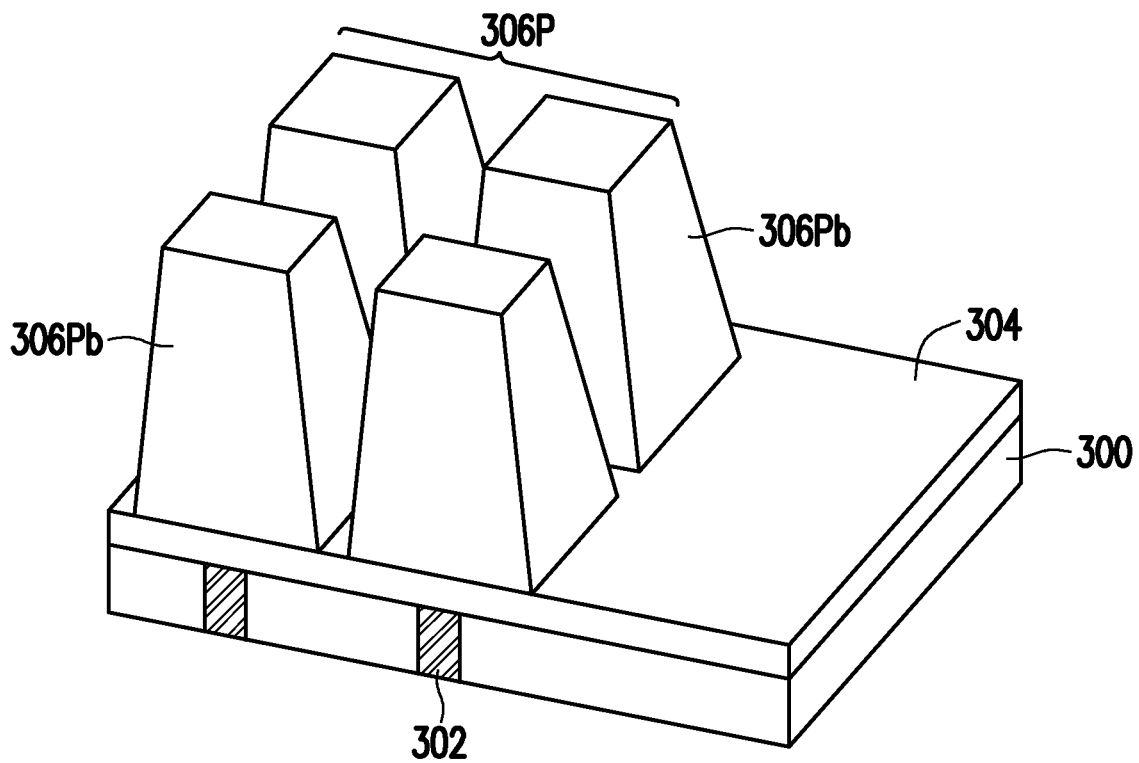
Figure 4:
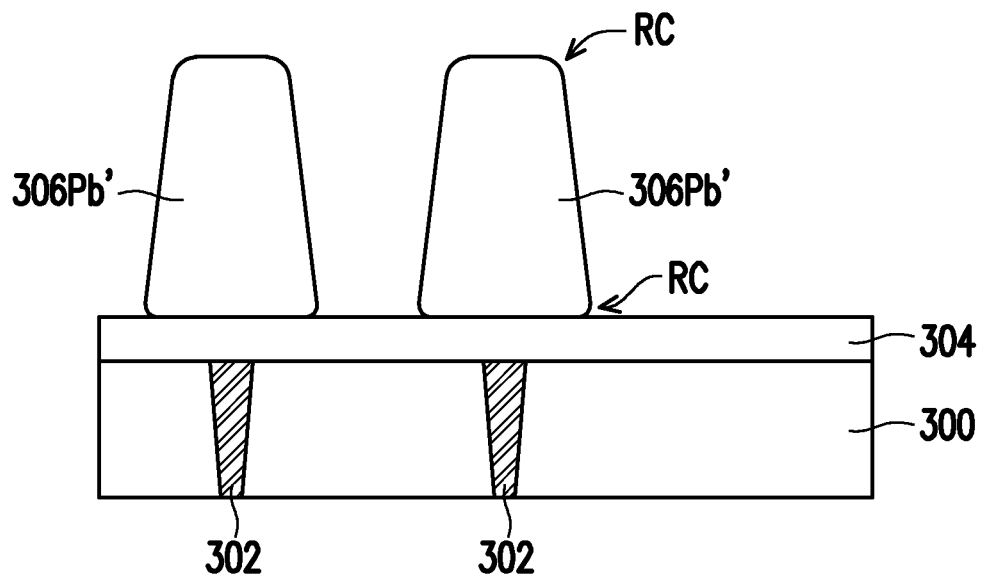

Referring to FIG. 3, in some embodiments, a bottom layer 300 having one or more connection structure 302 therein is provided. As shown in FIG. 3, in some embodiments, the connection structures 302 (only two vias are shown) may be formed in the bottom layer 300, and the connection structures 302 are similar to the conductive through vias 234 illustrated in FIG. 2. It is understood that the bottom layer 300 and the connection structure 302 are shown to represent a part of the underlying structure such as the semiconductor substrate and the interconnection structure as illustrated in the previous embodiments, and the patterns and configurations of the bottom layer 300 and the connection structure 302 should not be limited by the exemplary embodiments or drawings of this disclosure. In FIGS. 3-15, only a portion of the bottom layer 300 and the connection structure 302 is shown for illustration purposes. In some embodiments, the bottom layer 300 (or the underlying substrate) may include one or more active components such as transistors, diodes, optoelectronic devices and metallization structures together with one or more passive components.

Referring to FIG. 3, in some embodiments, an etch stop layer 304 and a sacrificial material layer 306 are sequentially formed over the bottom layer 300 covering the connections structures 302. In one embodiment, the material of the etch stop layer 304 includes silicon nitride, silicon oxycarbide (SiOC) or aluminum oxide. For example, the etch stop layer 304 may be formed by CVD such as plasma-enhanced CVD (PECVD), high-density-plasma chemical vapor deposition (HDP-CVD), and sub-atmospheric CVD (SACVD), atomic layer deposition (ALD), and physical vapor deposition (PVD). In one embodiment, the material of the sacrificial material layer 306 includes silicon oxide, silicon nitride or silicon carbon nitride (SiCN). For example, the sacrificial layer 306 may be formed by CVD or formed by spin-on coating. The materials of the etch stop layer 304 and the sacrificial material layer 306 are designed to have relatively high etching selectivity.

Referring to FIG. 4, in some embodiments, a first patterning process is performed to the sacrificial material layer 306, the sacrificial material layer 306 is patterned to form a block array 306P (i.e. an array of blocks 306Pb) on the etch stop layer 304. As shown in FIG. 4, in exemplary embodiments, the locations of the patterned blocks 306Pb correspond to the locations of the connection structures 302 so that the blocks 306Pb cover the underlying connection structures 302. In exemplary embodiments, the blocks 306Pb are shown to be blocks with bigger (wider) bottoms and smaller (narrower) tops and are of about the same dimensions. In some embodiments, the sidewalls of the blocks 306Pb in FIG. 4 are shown as slant or sloped sidewalls, and the blocks 306Pb are spaced apart from one another with a distance. It is understood that the blocks 306Pb may be shown to have substantially the same pattern design or configuration, however, the blocks 306Pb may have different patterns or configurations depending on product designs. In some embodiments, the patterning and the formation of the block array 306P include performing a photolithographic process and an anisotropic etching process to the sacrificial material layer 306. In some embodiments, a photoresist pattern (not shown) may be used as an etching mask so that portions of the sacrificial material layer 306 uncovered by the photoresist pattern are removed during the etching process, and then the photoresist pattern is removed thorough a stripping process.

Referring to FIG. 4', in some other embodiments, a corner rounding process is further performed to tune the blocks 306Pb into the blocks 306Pb' and turn the top and bottom corners of the blocks 306Pb into rounded corners RC. In some embodiments, the corner rounding process includes an isotropic etching process, and the profiles or configurations of the rounded corners RC are tuned through the etching conditions and time-controlled methods. In some embodiments, the corner rounding process includes an etching process using fluorine-containing gas such as $C_4F_6$ and/or $C_4F_8$, passivating on the sidewall(s) to form the round corners.

In alternative embodiments, by fine-tuning the conditions of the patterning process, the sacrificial material layer 306 may be patterned into rounded blocks 306Pb' through a single etching process.

Figure 5:
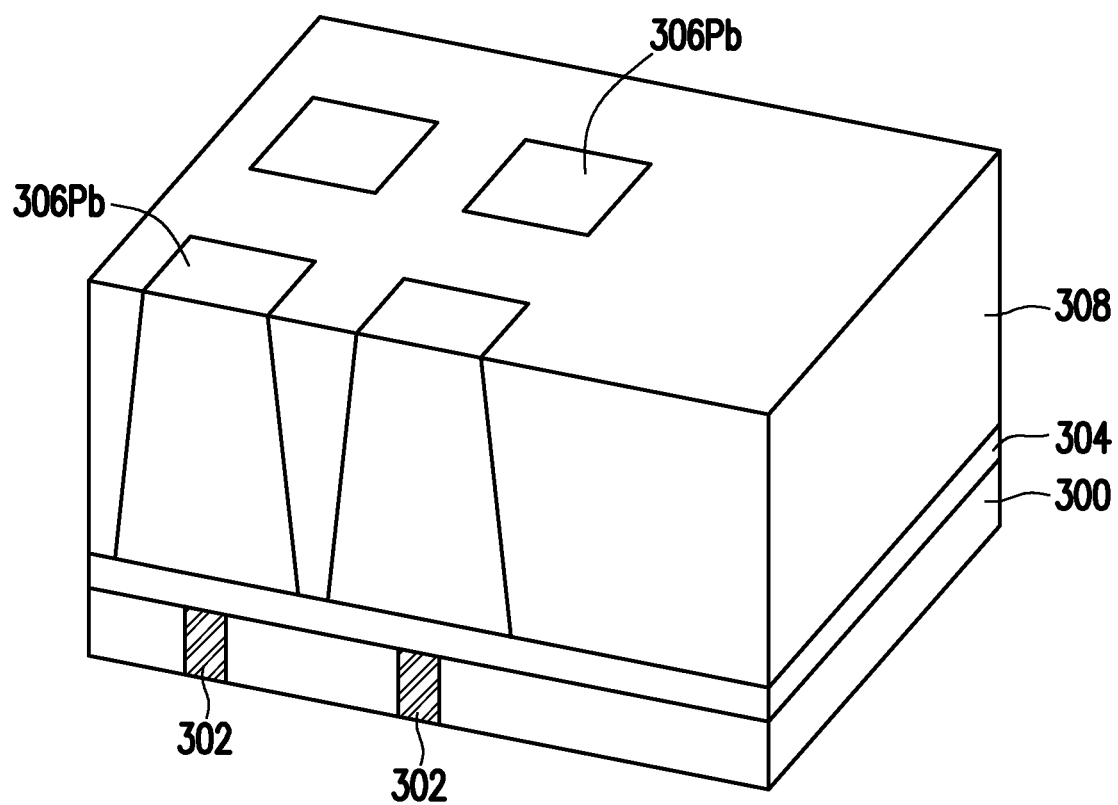
Figure 6:
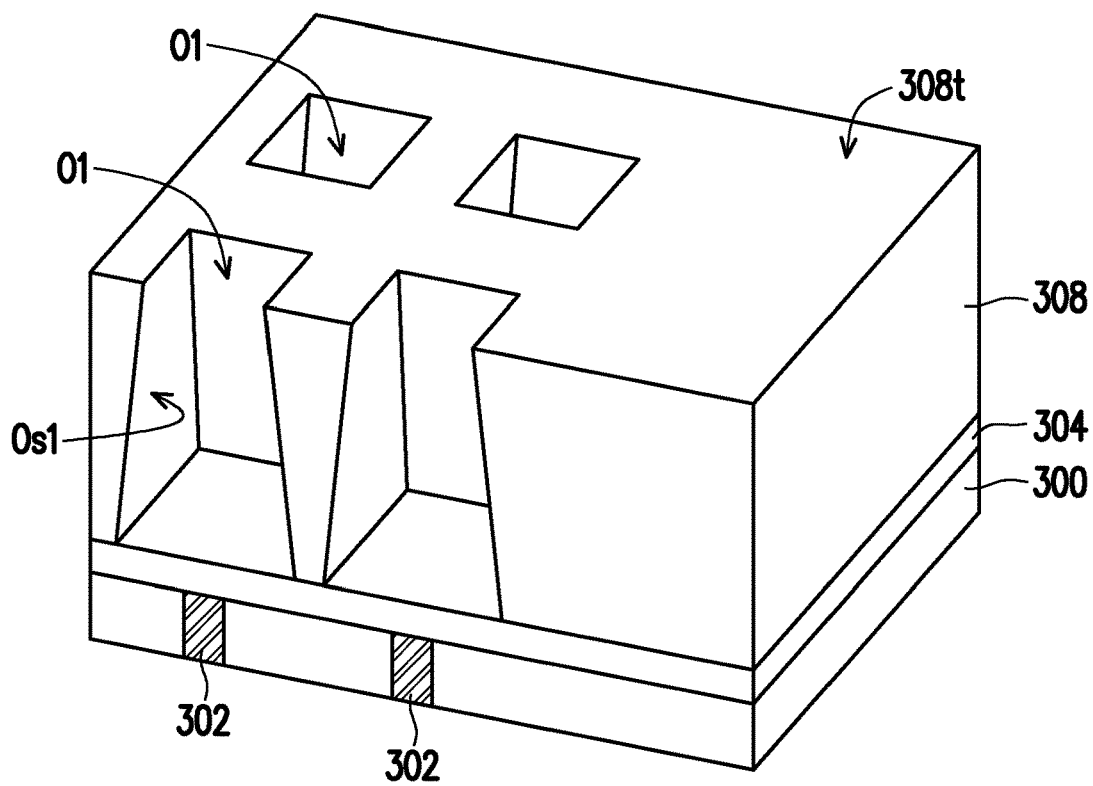
Figure 6:
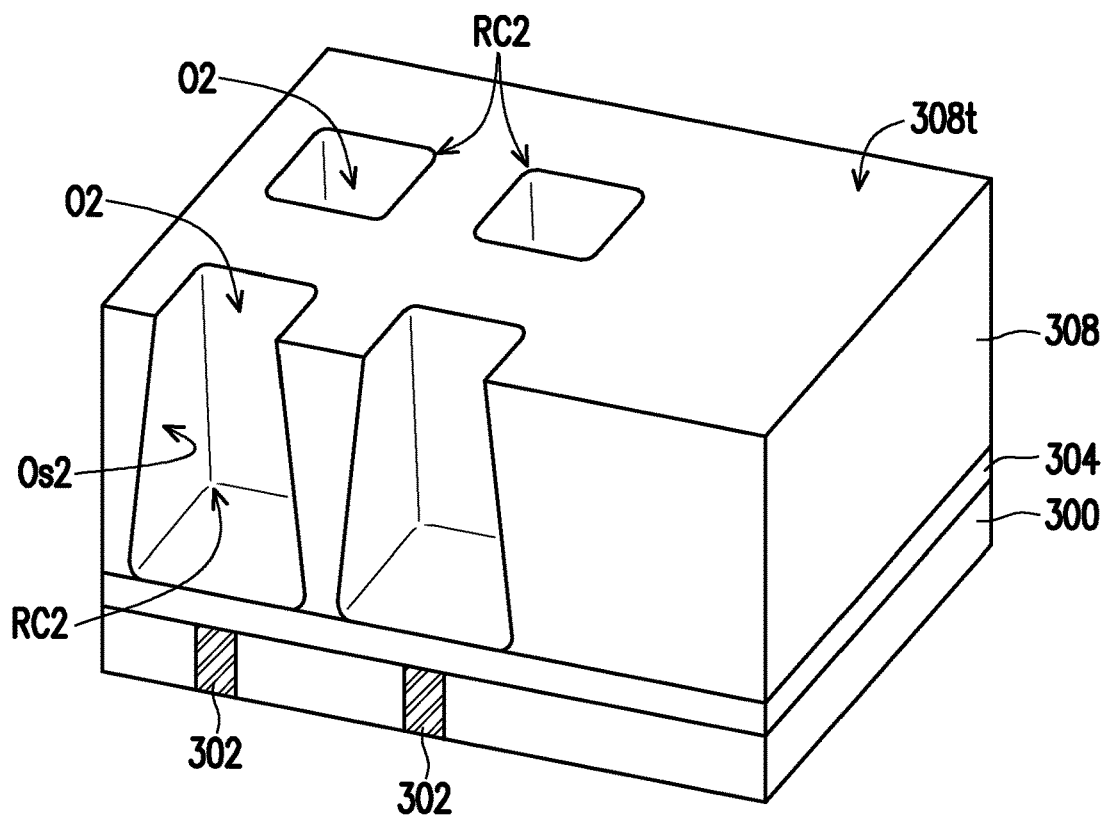

Referring to FIG. 5, in some embodiments, a first metallic material layer 308 is formed on the etch stop layer 304 and over the blocks 306Pb, filled up the gaps between the blocks 306Pb. In some embodiments, the first metallic material layer 308 includes a low resistivity metallic material, and the metallic material may include one or more materials selected from tungsten (W), tungsten carbon nitride (WCN), tantalum nitride (TaN), titanium nitride (TiN), and combinations thereof. In some embodiments, the metallic material is formed by CVD (such as, PECVD, laser-assisted CVD, metalorganic CVD (MOCVD)), ALD, and PVD (such as, sputtering, and e-beam evaporation). In some embodiments, the metallic material is formed by PVD. In alternative embodiments, the formation of the metallic material may include performing a plating process (such as electrochemical plating (ECP)). In one embodiment, the material of the first metallic material layer 308 includes W and/or TiN formed by MOCVD process or sputtering. The materials of the sacrificial material layer 306 and the first metallic material layer 308 are designed to have relatively high etching selectivity. In some embodiments, the first metallic material layer 308 is formed to be thick enough to cover all of the blocks 306Pb. In some embodiments, the first metallic material layer 308 is formed with a thickness larger than the height of the blocks 306Pb and a planarization process (such as a chemical mechanical polishing (CMP) process) is performed to planarize the first metallic material layer 308 until the tops of the blocks 306Pb are exposed.

Referring to FIG. 6, in some embodiments, openings O1 are formed in the first metallic material layer 308 by removing the sacrificial blocks 306Pb without removing the first metallic material layer 308. In some embodiments, the sacrificial blocks 306Pb are removed by performing a wet etching process. In one embodiment, the sacrificial material layer 306 includes silicon oxide, an oxide etching process, for example, a wet etching process with high selectivity of silicon oxide to the metallic material (e.g. TiN), is performed, so as to remove the exposed sacrificial blocks 306Pb, and the underlying etch stop layer 304 is hence exposed. In some embodiments, the openings O1 are shown to be larger at the bottoms and smaller at the tops, and have slant sidewalls Os1.

Referring to FIG. 6', in some other embodiments, following the process steps described in FIG. 4' and FIG. 5, the rounded blocks 306Pb' are removed to leave the openings O2 formed in the first metallic material layer 308. As seen in FIG. 6', the openings O2 have slant sidewalls Os2 but with rounded corners RC2. With the rounded corners RC2 to replace the sharp corners, better filling can be achieved and electrical discharge and current leakage often occurred at sharp corners or projected point is significantly alleviated.

Figure 7:
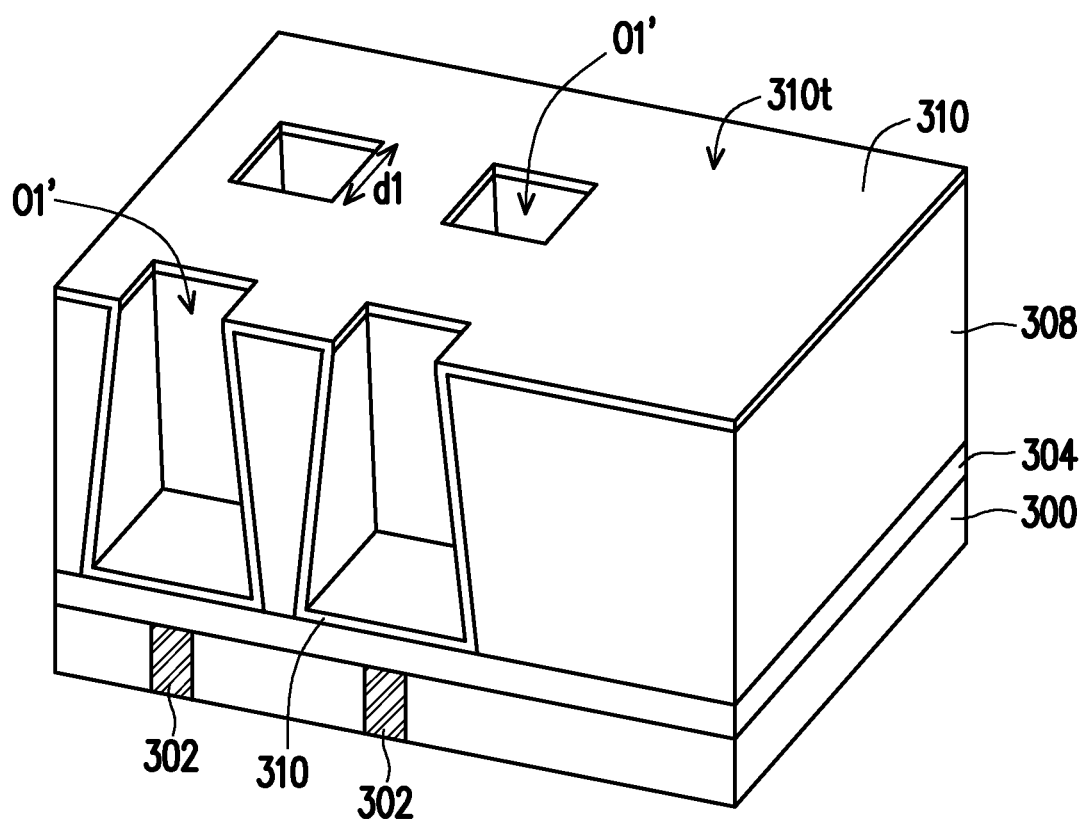

Referring to FIG. 7, in some embodiments, a first dielectric layer 310 is formed over the first metallic material layer 308, covering the openings O1 and the exposed etch stop layer 304. In some embodiments, the first dielectric layer 310 is conformally formed over the openings O1 with a substantially uniform thickness without filling up the openings O1. That is, the first dielectric layer 310 is conformal to the profiles of the openings O1, and conformal to the top surface 308t of the first metallic material layer 308. Following the formation of the first dielectric layer 310, due to the thickness of the first dielectric layer 310, the openings O1' are smaller than the openings O1, and the openings O1' are shown to be larger at the bottoms and smaller at the tops. In one embodiment, taking the opening O1' in a square shape as an example, the top of the opening O1' has a dimension d1.

In one embodiment, the material of the first dielectric layer 310 includes silicon oxide. In some embodiments, the material of the first dielectric layer 310 includes one or more high-k dielectric materials selected from zirconium oxide (e.g. $ZrO_2$), hafnium oxide (e.g. $HfO_2$), barium titanate (e.g. $BaTiO_3$), aluminum oxide (e.g. $Al_2O_3$), lanthanum oxide (e.g. $LaO_2$), titanium oxide, tantalum oxide (e.g. $Ta_2O_5$), yttrium oxide (e.g. $Y_2O_3$), BaZrO, HfZrO, HfLaO, HfTaO, HfTiO, or combinations thereof. In some embodiments, the formation of the first dielectric layer 310 includes one or more deposition processes selected from CVD (such as, PECVD, MOCVD and laser-assisted CVD), ALD and PVD (such as, sputtering and e-beam evaporation). In one embodiment, the first dielectric layer 310 is formed by ALD.

Figure 8:
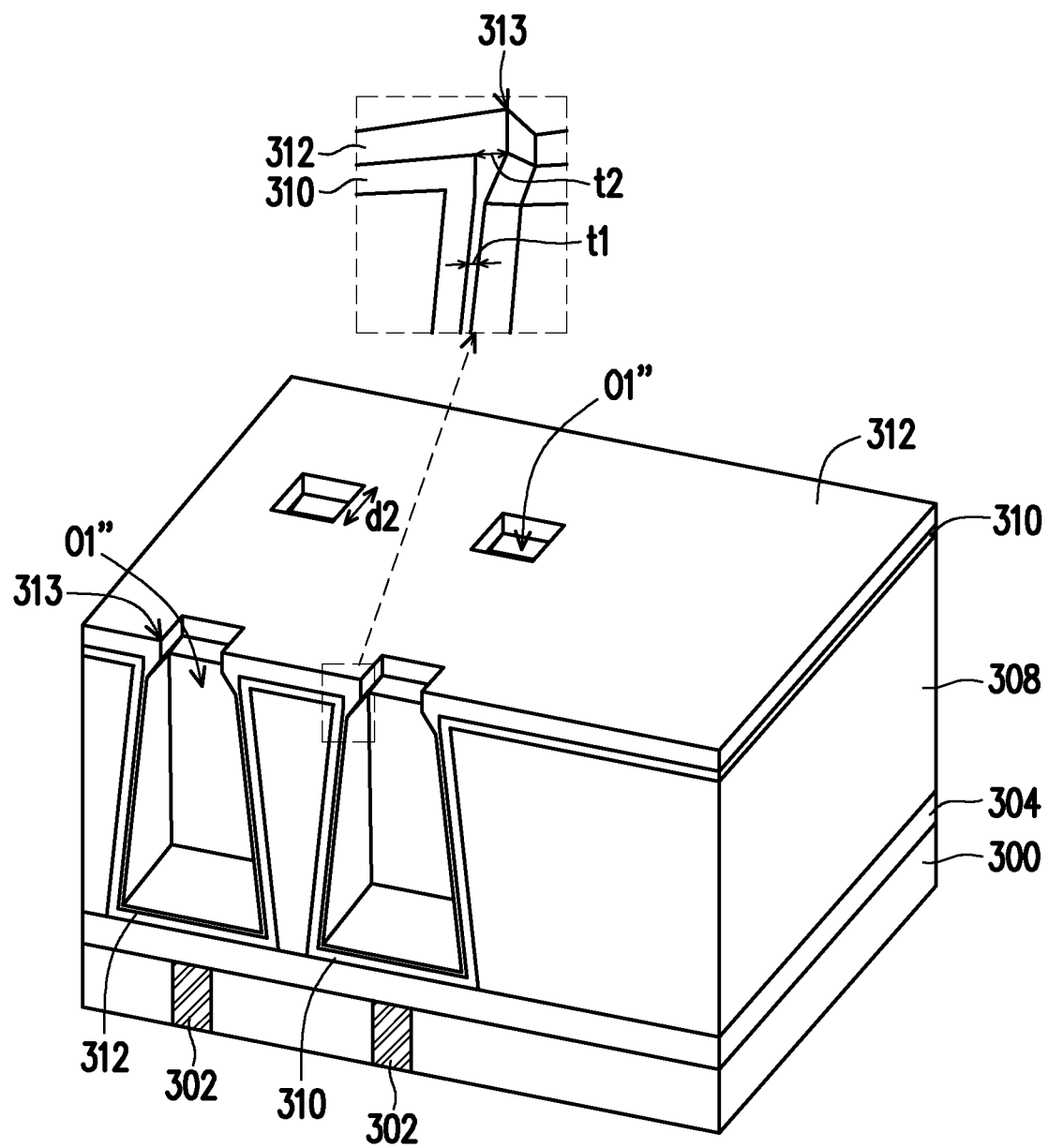

Referring to FIG. 8, a masking layer 312 is globally formed on and over the first dielectric layer 310. In some embodiments, the material of the masking layer includes silicon nitride. In some embodiments, the masking layer 312 is formed by CVD such as PECVD. The masking layer 312 is formed, though not fully conformally, generally following or agreeing with the profiles of the openings O1' with an average thickness t1. As seen in the partial enlarged view at the upper part of FIG. 8, at the edges of the tops of the openings O1", the masking layer 312 is formed with overhangs 313. That is, at the edges of the tops of the openings O1", the masking layer 312 is formed to be thicker. Due to the formation of the overhangs 313, the dimensions d2 of the tops of the openings O1" are further reduced. That is, the difference between the dimension d1 and the dimension d2 (i.e. (d1−d2)) is larger than the average thickness t1 of the masking layer 312 but is substantially equivalent to the thickness t2 of the overhang 313. The relative relationship is as follows.

$$(d1-d2) \approx t2 > t1$$

Figure 9:
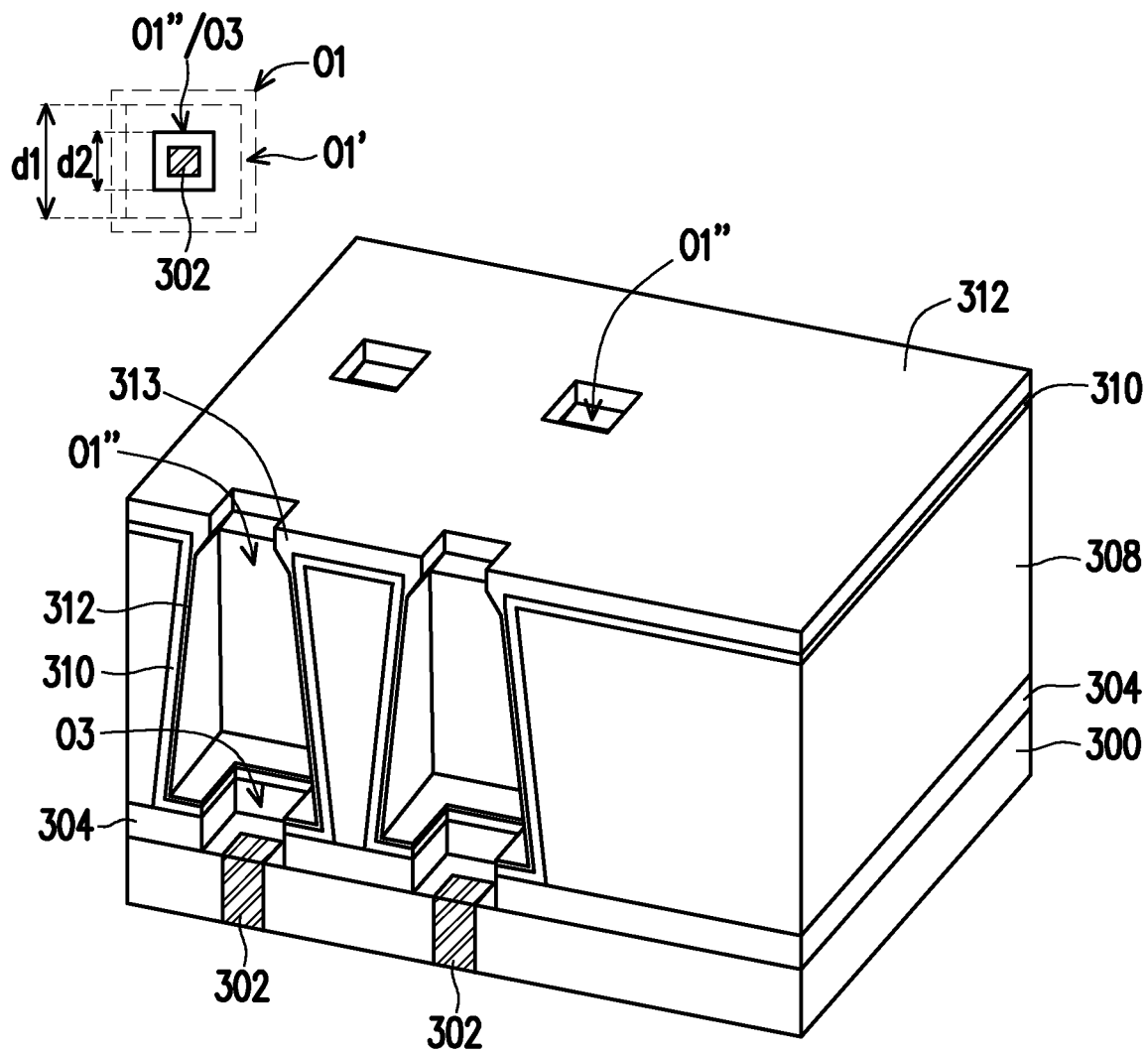

Referring to FIG. 9, in some embodiments, a second patterning process is performed to form openings O3 in the bottoms of the openings O1". In some embodiments, using the overhangs 313 of the masking layer 312 as the etching mask, portions of the stacked layers of the masking layer 312, the first dielectric layer 310 and the etch stop layer 304 at the bottoms of the openings O1" are removed to form the openings O3. As the overhangs 313 of the masking layer 312 at the top edges of the openings O1" are used as the etching masks, the patterns and the dimensions of the tops of the openings O1" are transferred to form the openings O3. In other words, as seen in the schematic top view at the upper left part of FIG. 9, the vertical projection of the opening O1" aligned with and fully overlaps with the vertical projection of the opening O3, and falls within the spans (in dotted line) of the vertical projections of the opening O1' and the opening O1 in a concentric way. In some embodiments, the dimensions of the openings O3 are larger than the sizes or dimension of the connection structures 302, so that the connection structures 302 are exposed by the openings O3.

In some embodiments, the stacked layers of the masking layer 312, the first dielectric layer 310 and the etch stop layer 304 at the bottoms of the openings O1" are patterned in one single continuous patterning/etching process. In some embodiments, the stacked layers of the masking layer 312, the first dielectric layer 310 and the etch stop layer 304 at the bottoms of the openings O1" are sequentially patterned through multiple etching processes. As shown in FIG. 9, in exemplary embodiments, the openings O3 in the stacked layers of the masking layer 312, the first dielectric layer 310 and the etch stop layer 304 at the bottoms of the openings O1" expose the connections structures 302 and a portion of the bottom layer 300. In some embodiments, the second patterning process include performing an anisotropic etching process, and no photoresist pattern is used as an etching mask herein.

Figure 10:
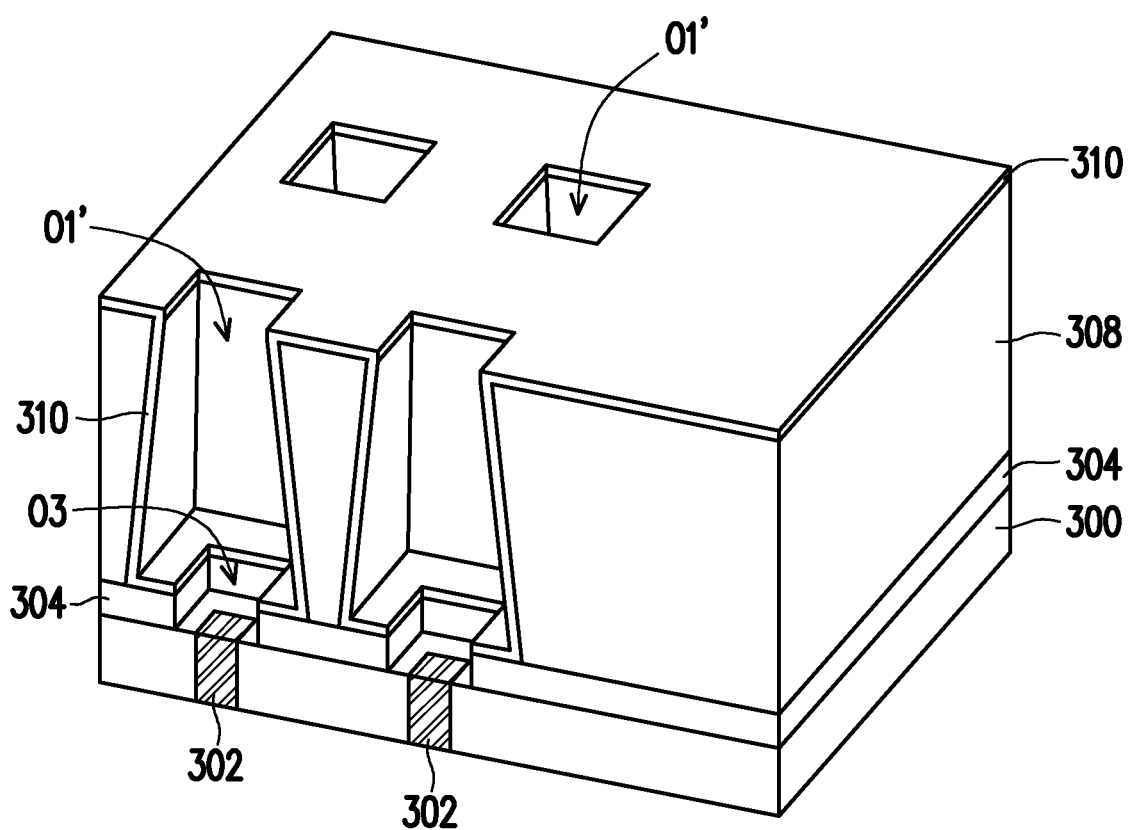

Referring FIG. 10, in some embodiments, the masking layer 312 is removed to expose the underlying first dielectric layer 310 and the openings O1' and openings O3. In some embodiments, the masking layer 312 is removed by performing an anisotropic etching process or an isotropic etching process, without removing or damaging the underlying first dielectric layer 310 and the connection structures 302. In some embodiments, after removing the masking layer 312, the exposed openings O1' having the dimension d1 are larger than the openings O3 having the dimension d2.

Figure 11:
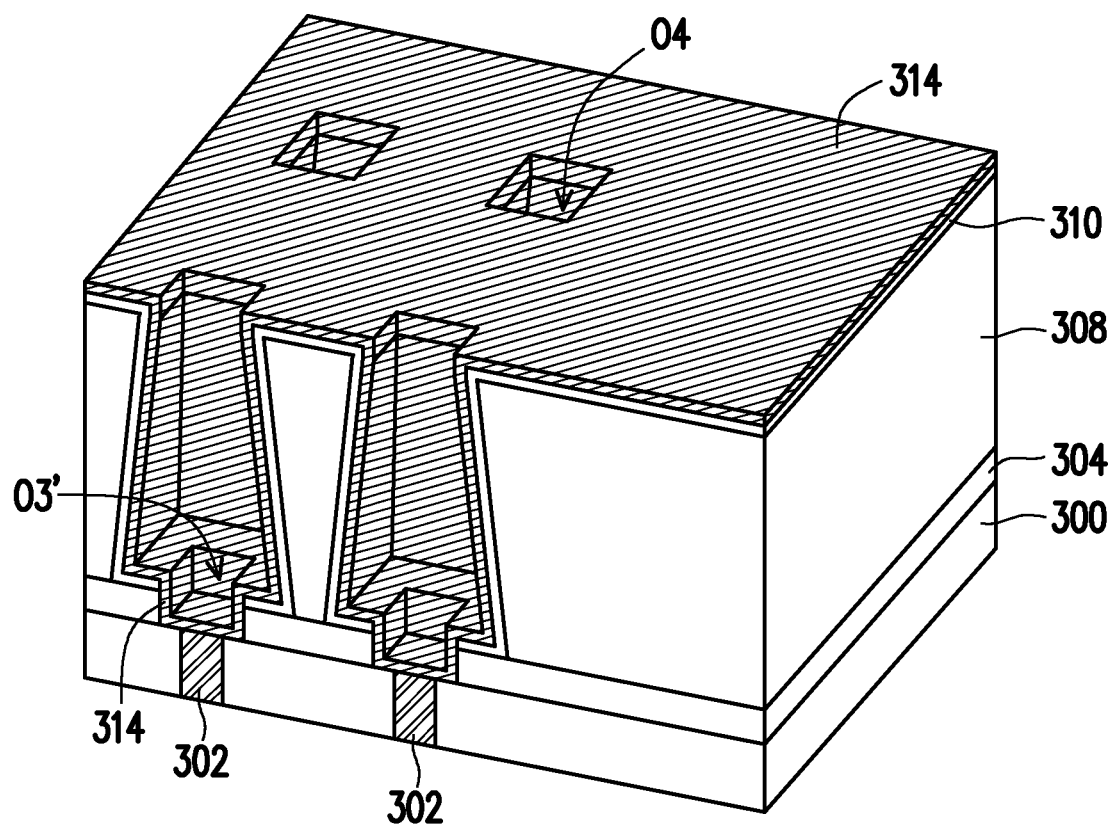

Referring to FIG. 10 and FIG. 11, in some embodiments, after removing the masking layer 312, a second metallic material layer 314 is formed on the first dielectric layer 310 and over the openings O1' and openings O3 without filling up the openings O1' and O3 to form openings O4 and openings O3' respectively. In some embodiments, the second metallic material layer 314 is conformally formed over the openings O1' and O3 with a substantially uniform thickness without filling up the openings O1' and O3. That is, the second metallic material layer 314 is conformal to the profiles of the openings O1' and O3. As seen in FIG. 11, the second metallic material layer 314 is in direct contact with the connection structures 302 and extends from the connection structures 302, through the first metallic material layer 308 and over the top surface 310t of the first dielectric layer.

In some embodiments, the second metallic material layer 314 includes a low resistivity metallic material, and the metallic material may include one or more materials selected from W, WCN, TaN, TiN, and combinations thereof. In some embodiments, the metallic material is formed by CVD (such as, PECVD, laser-assisted CVD, MOCVD), ALD, and PVD (such as, sputtering, and e-beam evaporation). In one embodiment, the material of the metallic material layer 308 includes titanium nitride (TiN) formed by MOCVD, ALD or sputtering. In some embodiments, the materials of the first metallic material layer 308 and the second metallic material layer 314 are the same. In some embodiments, the materials of the first metallic material layer 308 and the second metallic material layer 314 are designed to be different. In some embodiments, the second metallic material layer 314 is formed with a substantially uniform thickness and the appropriate thickness is designed based on the product requirements.

Figure 12:
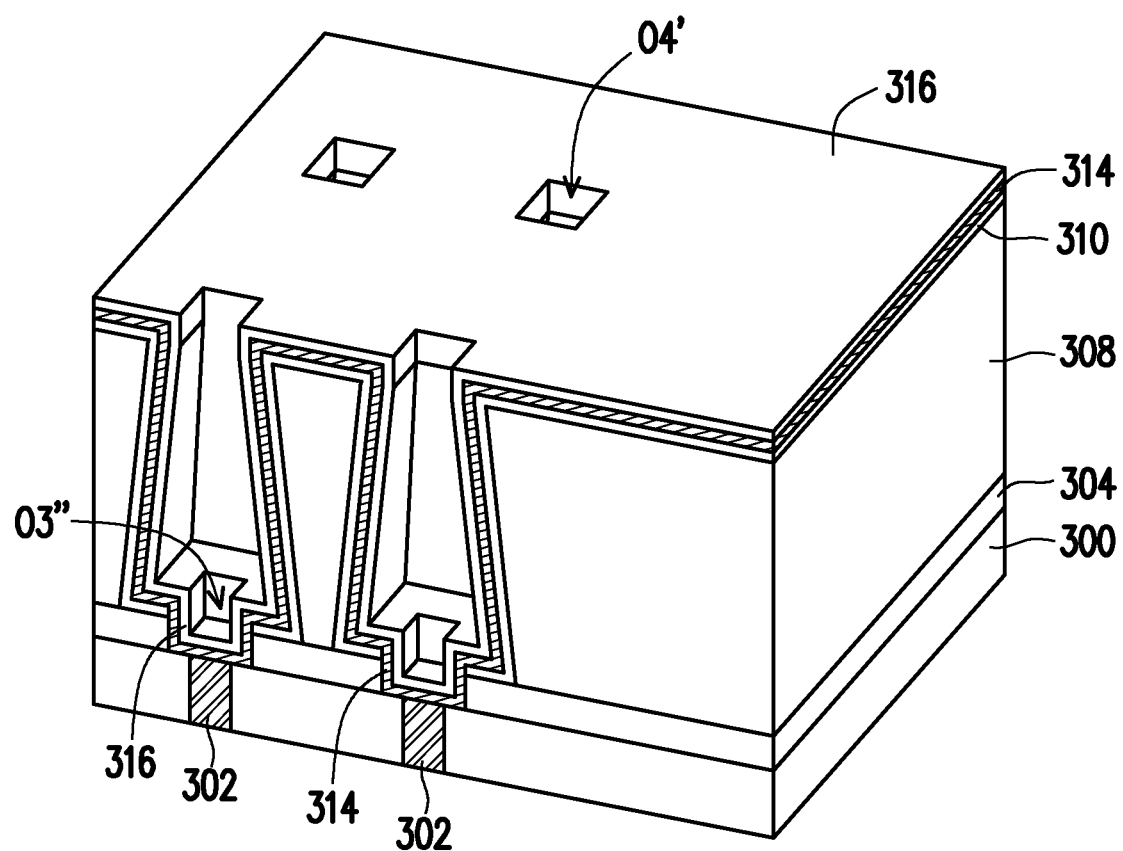

Referring to FIG. 12, in some embodiments, a second dielectric layer 316 is formed over the second metallic material layer 314 covering the openings O4 and O3' without filling the openings O4 and O3' to form the openings O4' and O3" respectively. In some embodiments, the second dielectric layer 316 is conformally formed over the openings O4 and O3' with a substantially uniform thickness without filling up the openings O4 and O3'.

It is understood that following the formation of the first dielectric layer 310, the second metallic material layer 314 and the second dielectric layer 316, due to the thickness of the respective layer, the openings become smaller and are denoted with a different reference label, but the locations and configurations basically remain the same. For example, the openings O1', O1", O4 and O4' are shown to be openings larger at the bottoms and smaller at the tops and with slant sidewalls, while the openings O3, O3', and O3" are shown to be openings with substantially vertical sidewalls. It is understood that the openings may be shown in square top view shapes as examples, but the shapes of the openings may be rectangular, octagonal, polygonal or even oval or round from the top view.

In one embodiment, the material of the second dielectric layer 316 includes silicon oxide. In some embodiments, the material of the second dielectric layer 316 includes one or more high-k dielectric materials selected from zirconium oxide (e.g. $ZrO_2$), hafnium oxide (e.g. $HfO_2$), barium titanate (e.g. $BaTiO_3$), aluminum oxide (e.g. $Al_2O_3$), lanthanum oxide (e.g. $LaO_2$), titanium oxide, tantalum oxide (e.g. $Ta_2O_5$), yttrium oxide (e.g. $Y_2O_3$), BaZrO, HfZrO, HfLaO, HfTaO, HfTiO, or combinations thereof. In some embodiments, the formation of the second dielectric layer 316 includes one or more deposition processes selected from CVD, ALD and PVD. In some embodiments, the materials of the first dielectric layer 310 and the second dielectric layer 316 are the same. In some embodiments, the materials of the first dielectric layer 310 and the second dielectric layer 316 are different.

Figure 13:
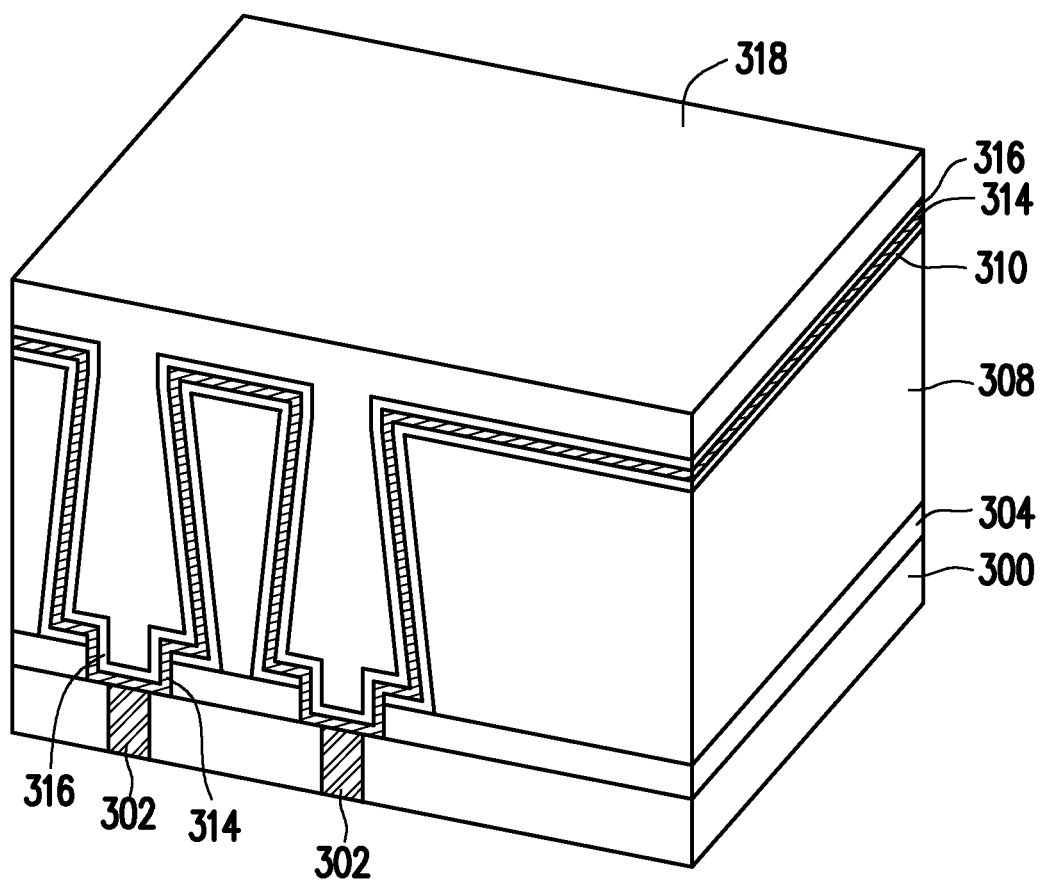

Referring to FIG. 13, in some embodiments, a third metallic material layer 318 is formed on the second dielectric layer 316 and fills up the openings O4' and O3". In some embodiments, the third metallic material layer 318 includes a low resistivity metallic material, and the metallic material may include one or more materials selected from titanium (Ti), tungsten (W), tantalum (Ta), ruthenium (Ru), molybdenum (Mo), nitride thereof, alloys thereof and combinations thereof. In some embodiments, the third metallic material layer 318 includes W, WCN, TaN, TiN, and combinations thereof. In some embodiments, the metallic material is formed by CVD (such as, PECVD, laser-assisted CVD, metalorganic CVD (MOCVD)), ALD, and PVD (such as, sputtering, and e-beam evaporation). In alternative embodiments, the formation of the metallic material may include performing a plating process (such as electrochemical plating (ECP)). In one embodiment, the material of the third metallic material layer 318 includes titanium nitride (TiN) formed by MOCVD process or sputtering. In some embodiments, the third metallic material layer 318 is formed to be thick enough to fill up the openings and cover all of the underlying layers.

Figure 14:
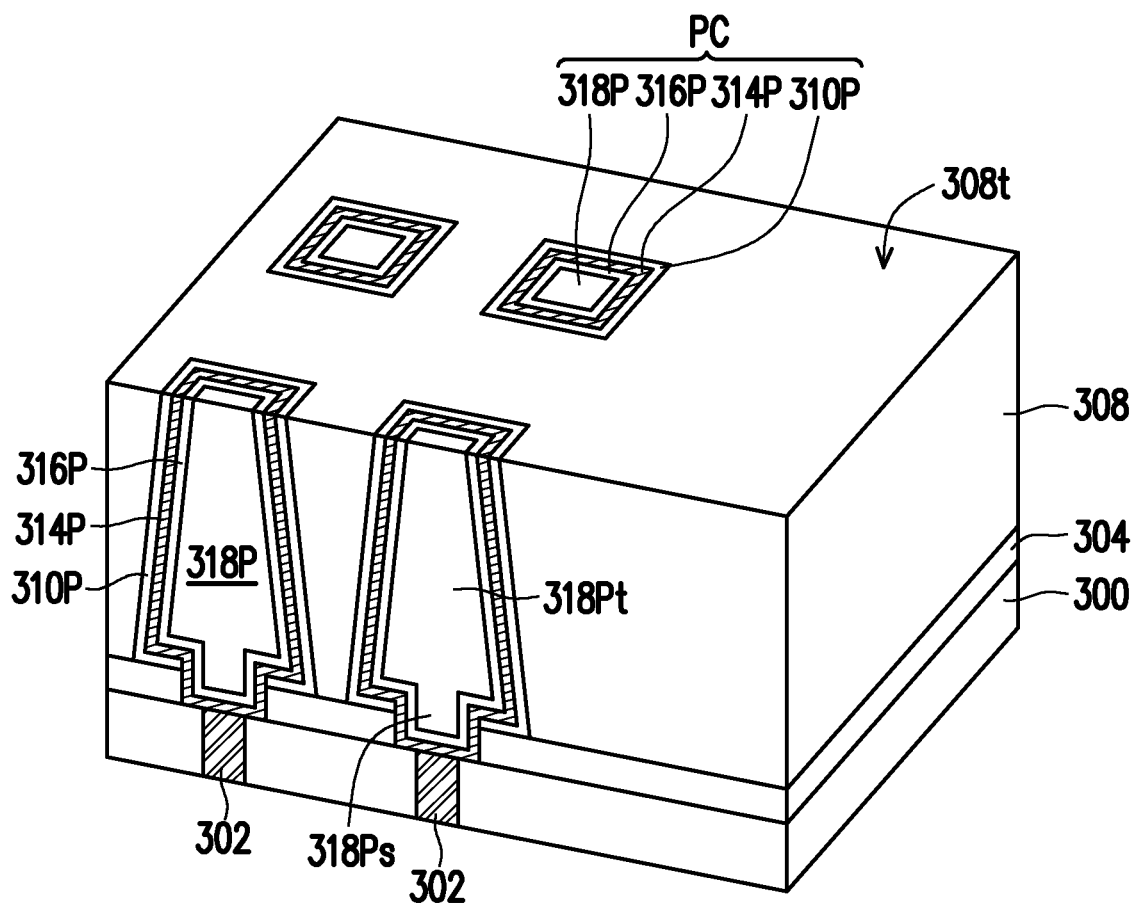

Referring to FIG. 14, in some embodiments, a planarization process is performed to the third metallic material layer 318 and the underlying layers 316, 314 and 310. In some embodiments, through performing the planarization process, the third metallic material layer 318, the second dielectric layer 316, the second metallic material layer 314 and the first dielectric layer 310 are partially removed until the top surface 308t of the first metallic material layer 308 is exposed. In some embodiments, after performing the planarization process, the contiguous third metallic material layer 318, second dielectric layer 316, second metallic material layer 314 and first dielectric layer 310 are partially removed and become separate portions remained within the openings O1 and O3 (i.e. the remained portions).

In some embodiments, after performing the planarization process, for the remained portions within the openings O1 and O3, each remain portion inside each opening O1 and O3 includes a third metallic material pillar 318P (each as the core) wrapped by a second dielectric sheath 316P, a second metallic material sheath 314P and a first dielectric sleeve 310P sequentially (from inner core to outer layers). In one embodiment, the planarization process includes one or more of an etching process, a grinding process or a chemical mechanical polishing (CMP) process. As seen in FIG. 14, from the top view, the first metallic material layer 308 is shown to be an adjoining contiguous layer or block, and the tops of the third metallic material pillar 318P, the second dielectric sheath 316P, the second metallic material sheath 314P and the first dielectric sleeve 310P are exposed from the planarized first metallic material layer 308. In some embodiments, as seen in FIG. 14, the third metallic material pillar 318P (the core) is shown in a square shape from to top view, and the second dielectric sheath 316P, the second metallic material sheath 314P and the first dielectric sleeve 310P are sequentially wrapped around and surround the third metallic material pillar 318P concentrically. For example, the core third metallic material pillar 318P, the second dielectric sheath 316P, the second metallic material sheath 314P and the first dielectric sleeve 310P may be regarded as a pillar-shaped or vase-shaped structure or capacitor structure PC, which is surrounded and supported by the first metallic material layer 308. From the cross-sectional view, the core third metallic material pillar 318P includes a trapezoid portion 318Pt mainly surrounded by the first metallic material layer 308 and a stem portion 318Ps below the trapezoid portion 318Pt and surrounded by the etch stop layer 304 and the first metallic material layer 308.

Figure 15:
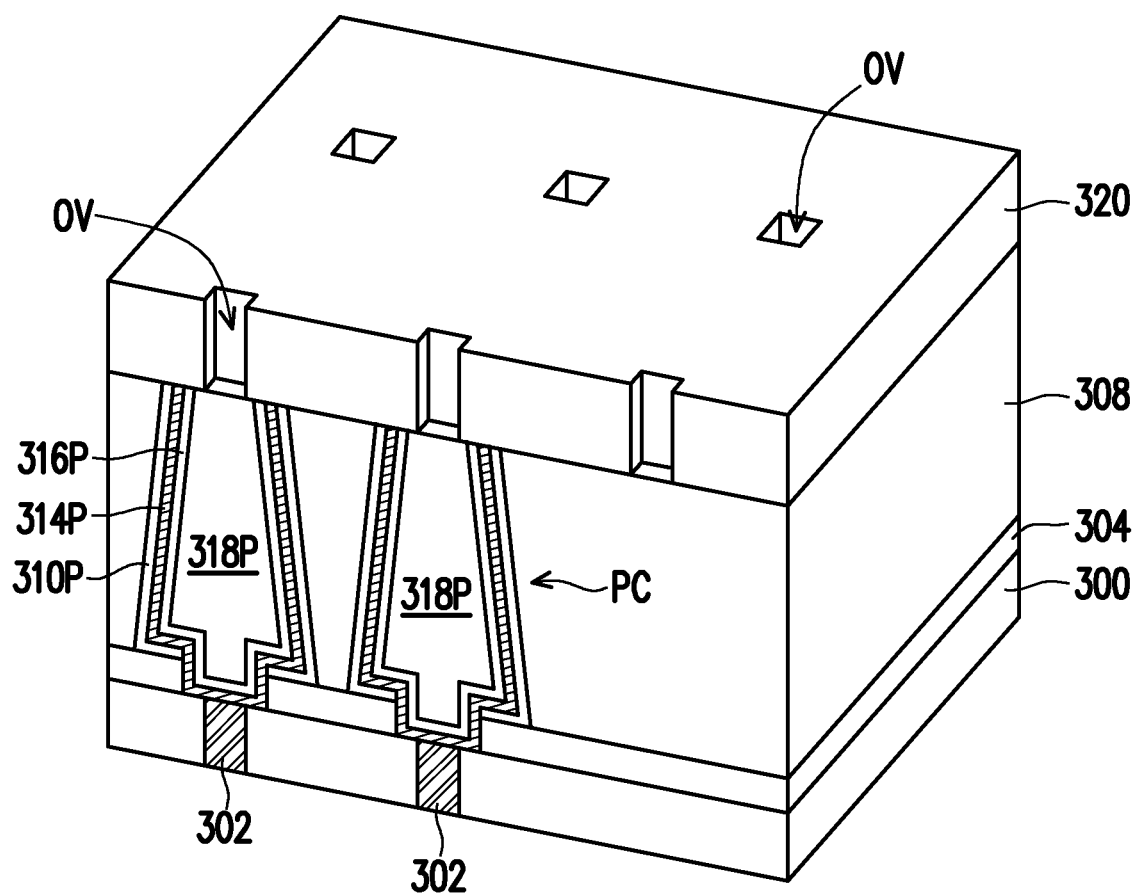

Referring to FIG. 15, an insulation layer 320 is formed over the planarized structure and on the top surface 308t of the first metallic material layer 308 and covers the exposed pillar shaped structures PC (i.e. third metallic material pillars 318P, the second dielectric sheaths 316P, the second metallic material sheaths 314P and the first dielectric sleeves 310P). In some embodiments, the insulation layer 320 is formed with via openings OV. Some of the via openings OV are formed to expose the core third metallic material pillars 318P, while some of the via openings OV are formed to expose the first metallic material layer 308. The formation of the insulation layer 320 having the openings OV may include depositing an insulation material (not shown) over the planarized structure and on the first metallic material layer 308 and performing a patterning process to remove portions of the insulation material to form the openings OV exposing the third metallic material pillars 318P and the first metallic material layer 308. In some embodiments, all of the third metallic material pillars 318P are exposed by the via openings OV, and one via opening OV is formed above one third metallic material pillar 318P. In one embodiment, the material of the insulation layer 320 includes silicon oxide. In some embodiments, the material of the insulation layer 320 includes one or more high-k dielectric materials. The materials and related formation methods will not be repeated herein.

Figure 16:
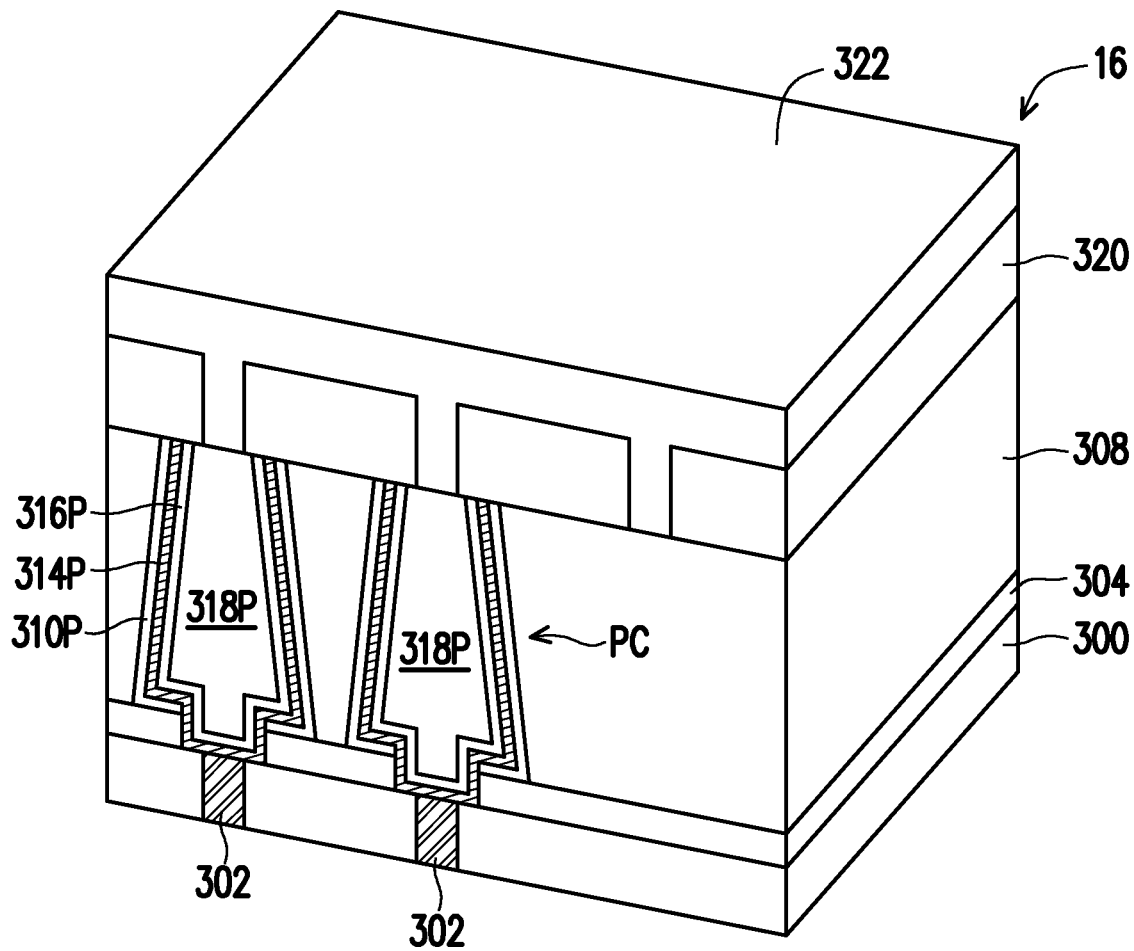
Figure 17:
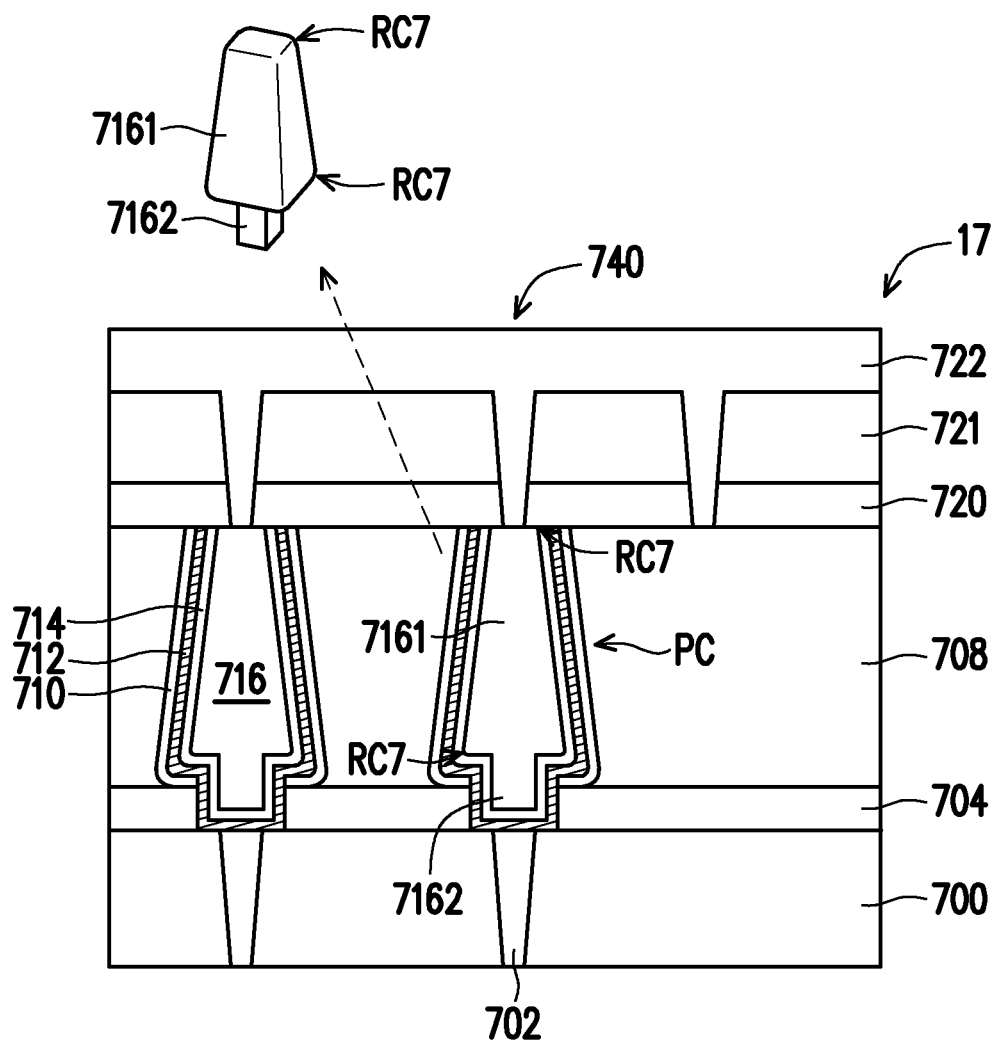
FIG. 17 is a schematic cross-sectional view showing a portion of the three-dimensional integrated structure in accordance with some embodiments of the disclosure.

Referring to FIG. 16, in some embodiments, a fourth metallic material layer 322 is formed over the insulation layer 320 filling up the via openings OV, and a three-dimensional integrated structure 16 is formed. In some embodiments, the fourth metallic material layer 322 filled inside the via openings may be referred as the via plug portions, and the via plug portions penetrate through the insulation layer 320 and reach the underlying third metallic material pillars 318P and the first metallic material layer 308. Through the via plug portions of the fourth metallic material layer 322, the fourth metallic material layer is in direct contact with the third metallic material pillars 318P and the first metallic material layer 308 exposed by the via openings OV. The fourth metallic material layer 322, the third metallic material pillars 318P and the first metallic material layer 308 are electrically connected, while the second metallic material sheaths 314P and the connection structures 302 are electrically connected. In some embodiments, within the three-dimensional integrated structure 16, the stacked structure of the core third metallic material pillar 318P, the second dielectric sheath 316P and the second metallic material sheath 314P constitutes a metal-insulator-metal (MIM) element or capacitor structure, and the stacked structure of the second metallic material sheath 314P, the first dielectric sleeve 310P and the first metallic material layer 308 constitutes another MIM capacitor structure, and the fourth metallic material layer 322 electrically connects these MIM elements, and a component array 340 is formed. For the component array 340, the metallic material layers made of electro-conductive metallic materials may function as electrodes and may be regarded as electrode layers for the capacitors.

In some embodiments, the fourth metallic material layer 322 includes a low resistivity metallic material, and the metallic material may include one or more materials selected from aluminum (Al), copper (Cu), titanium (Ti), tungsten (W), tantalum (Ta), ruthenium (Ru), molybdenum (Mo), nitride thereof, alloys thereof and combinations thereof. In some embodiments, the fourth metallic material layer 322 includes W, WCN, TaN, TiN, and combinations thereof. In some embodiments, the metallic material is formed by CVD (such as, PECVD, laser-assisted CVD, metalorganic CVD (MOCVD)), ALD, and PVD (such as, sputtering, and e-beam evaporation). In alternative embodiments, the formation of the metallic material may include performing a plating process (such as electrochemical plating (ECP)). In one embodiment, the material of the fourth metallic material layer 322 includes W and/or TiN formed by MOCVD process or sputtering. In some embodiments, the fourth metallic material layer 322 is formed to be thick enough to fill up the via openings and cover all of the underlying layers.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Through the formation of the 3D integrated structure including the component array, high aspect ratio pillar shaped capacitor structures may be formed in a limited area to provide large capacitance.

FIG. 17 is a schematic cross-sectional view showing a portion of the three-dimensional integrated structure fabricated following the manufacturing method in accordance with some embodiments of the disclosure. In exemplary embodiments, the 3D integrated structure 17 may be formed following the process steps as illustrated in FIG. 3, FIG. 4', FIG. 5, FIG. 6' and FIGS. 7-16. The materials and formation methods of the described layers, parts or elements similar to those described in the process steps of the previous embodiments will not be described in details herein again.

In some embodiments, the 3D integrated structure 17 includes a component array 740 disposed over a bottom layer 700 and the connection structures 702, and an insulation layer 704 is disposed between the component array 740 and the bottom layer 700. In some embodiments, the component array 740 includes pillar-shaped or vase-shaped capacitor structures PC separated from one another by the outer electrode layer 708. In some embodiments, the pillar-shaped structure PC includes an electrode pillar 716, an inner dielectric sheath 714 surrounding the core electrode pillar 716, a middle electrode layer 712 surrounding the dielectric sheath 714 and an outer dielectric sleeve 710 surrounding the middle electrode layer 712. Also, the outer electrode layer 708 wraps around the outer dielectric sleeve 710. As seen in FIG. 17, in some embodiments, the component array 740 also includes a stack of a lower insulating layer 720 and an upper insulating layer 721 and a top electrode layer 722 that is disposed on the upper insulating layer 721 and penetrates through the stack to be connected with the electrode pillars 716 and the outer electrode layer 708. In some embodiments, due to the corner rounding process performed during the manufacturing processes, the electrode pillars 716 have rounded corners RC7. In some embodiments, similar to the pillar 318P, the electrode pillar 716 includes a trapezoid portion 7161 and a stem portion 7162 disposed below and connected with the trapezoid portion 7161, and the trapezoid portion 7161 have round top and round bottom corners RC7, the outer layers 714, 712 and 710 conformal to the profiles of the electrode pillars also have rounded corners, instead of sharp corners. Such design of the 3D integrated structure 17 can improve the issues of current leakage by minimizing sharp corners or projected points.

In the above embodiments, the outer electrode layer not only supports the pillar-shaped structures but also function with the pillar-shaped structures as capacitor elements, so that high area capacitance is achieved. Accordingly, the integrated structure is applicable for memories such as DRAM, and the large capacitance provided by the capacitors may increase the data retention and sensing window of the memories, thus leading to better electrical performance of the semiconductor devices.

In some embodiments of the present disclosure, a three-dimensional integrated structure including a substrate having conductive features therein and a component array disposed over the substrate and on the conductive features is provided. The component array includes a metallic material layer and capacitor structures separated by the metallic material layer. Each of the capacitor structures includes a first metallic pillar, a first dielectric sheath surrounding the first metallic pillar, a second metallic sheath surrounding the first dielectric sheath, and a second dielectric sleeve surrounding the second metallic sheath. The metallic material layer laterally encapsulates the capacitor structures.

In some embodiments of the present disclosure, a three-dimensional integrated structure is described. Thea three-dimensional integrated structure includes a bottom layer having conductive connection structures therein, and capacitor structures disposed over the bottom layer and on the conductive connection structure. The integrated structure also includes a first metallic layer laterally wrapping the capacitor structures, an insulation layer disposed on the first metallic layer and the capacitor structures, and a second metallic layer disposed on the insulation layer. The capacitor structures are separated by the first metallic layer. Each of the capacitor structures includes a metallic pillar, a dielectric sheath surrounding the metallic pillar, a metallic sheath surrounding the dielectric sheath, and a dielectric sleeve surrounding the metallic sheath.

In some embodiments of the present disclosure, a method for forming a three-dimensional integrated structure is described. A bottom layer with connection features therein is provided. An insulation layer is formed on the bottom layer covering the connection features. Sacrificial mask patterns are formed on the insulation layer and over the bottom layer. A first metallic material layer is formed over the sacrificial mask patterns and fills up gaps between the sacrificial mask patterns. The sacrificial mask patterns are removed to form first openings in the first metallic material layer. A first dielectric material layer is formed over the first metallic material layer, fully covering the first openings. A masking layer is formed over the first dielectric material layer, fully covering the first dielectric layer inside the first openings. Second openings are formed at bottoms of the first openings using the masking layer as a mask. The masking layer is removed leaving the first dielectric material layer exposed. A second metallic material layer is formed on the first dielectric material layer, fully covering the first dielectric layer inside the first openings and fully covering the second openings. A second dielectric material layer is formed on the second metallic material layer, fully covering the second metallic material layer inside the first openings and the second openings. A third metallic material layer is formed on the second dielectric material layer, fully covering the second dielectric material layer inside the first and second openings. After partially removing the third metallic material layer, the second dielectric material layer, the second metallic material layer and the first dielectric material layer until the first metallic material layer is exposed, third metallic pillars, second dielectric sheaths, second metallic sheaths and first dielectric sleeves are formed within the first and second openings. An insulating layer is formed over the first metallic material layer covering the third metallic pillars, the second dielectric sheaths, the second metallic sheaths and the first dielectric sleeves. A fourth metallic material layer is formed on the insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated structure, comprising:
a substrate having conductive features therein; and
a component array disposed over the substrate and on the conductive features, wherein the component array includes a metallic material layer and capacitor structures separated by the metallic material layer, and each of the capacitor structures includes:
a first metallic pillar;
a first dielectric sheath surrounding the first metallic pillar;
a second metallic sheath surrounding the first dielectric sheath; and
a second dielectric sleeve surrounding the second metallic sheath,
wherein the metallic material layer is filled between the capacitor structures and laterally encapsulates the capacitor structures, and the capacitor structures penetrate through the metallic material layer to reach the conductive features.

2. The structure of claim 1, wherein the metallic material layer physically contacts the second dielectric sleeves of the capacitor structures, and the second dielectric sleeves disposed between the metallic material layer and the second metallic sheaths keep the metallic material layer apart from the second metallic sheaths of the capacitor structures.

3. The structure of claim 1, further comprising an insulation layer disposed on the metallic material layer and the capacitor structures and an electrode layer disposed on the insulation layer.

4. The structure of claim 3, wherein the electrode layer includes via plug portions penetrating through the insulation layer to be connected to the first metallic pillars and the metallic material layer.

5. The structure of claim 1, further comprising an etch stop layer located between the metallic material layer and the substrate, wherein the capacitor structures penetrate through the etch stop layer, and the second metallic sheaths are in contact with and are electrically connected with the conductive features.

6. The structure of claim 5, further comprising transistors in the substrate, wherein the capacitor structures are electrically connected with the transistors through the second metallic sheaths and the conductive features.

7. The structure of claim 1, wherein at least one first metallic pillar includes round corners.

8. The structure of claim 1, wherein a material of the first dielectric sheath comprises an oxide material or a high-k dielectric material, and a material of the second dielectric sleeve comprises an oxide material or a high-k dielectric material.

9. A three-dimensional integrated structure, comprising:
a bottom layer having conductive connection structures therein;
capacitor structures disposed over the bottom layer and on the conductive connection structure;
a first metallic layer filling between and laterally wrapping the capacitor structures, wherein the capacitor structures penetrate through the first metallic layer and are separated by the first metallic layer;
an insulation layer disposed on the first metallic layer and the capacitor structures; and
a second metallic layer disposed on the insulation layer,
wherein each of the capacitor structures includes:
a metallic pillar;
a dielectric sheath surrounding the metallic pillar;
a metallic sheath surrounding the dielectric sheath; and
a dielectric sleeve surrounding the metallic sheath.

10. The structure of claim 9, wherein the first metallic layer physically contacts the dielectric sleeves of the capacitor structures, and the dielectric sleeves isolate the first metallic layer from the metallic sheaths of the capacitor structures.

11. The structure of claim 10, further comprising an insulating layer disposed on the bottom layer, between the bottom layer and the first metallic layer and between the bottom layer and the capacitor structures.

12. The structure of claim 9, wherein the metallic pillar includes a trapezoid portion and a stem portion connected to the trapezoid portion, and the stem portion is disposed between the trapezoid portion and the conductive connection structure.

13. The structure of claim 12, wherein the trapezoid portion has round corners.

14. The structure of claim 9, wherein the metallic sheaths are in contact with and are electrically connected with the conductive connection structures.

15. The structure of claim 9, wherein the second metallic layer is electrically connected with the metallic pillars and the first metallic layer.

16. The structure of claim 9, wherein materials of the first metallic layer, the second metallic layer and the metallic pillars are different.

17. A three-dimensional integrated structure, comprising:
a substrate having conductive features therein; and
a component array disposed over the substrate and on the conductive features, wherein the component array includes:
a first metallic material layer;
capacitor structures laterally wrapped by the first metallic material layer, and the capacitor structures being separated by the first metallic material layer filled there-between, wherein the capacitor structures penetrate through the metallic material layer to reach the conductive features;
an insulation layer disposed on the first metallic material layer and the capacitor structures; and
a second metallic material layer disposed on the insulation layer,
wherein each of the capacitor structures includes:
a first metallic pillar;
a first dielectric sheath surrounding the first metallic pillar;
a second metallic sheath surrounding the first dielectric sheath; and
a second dielectric sleeve surrounding the second metallic sheath.

18. The structure of claim 17, further comprising an etch stop layer located between first metallic material layer and the conductive features in the substrate, wherein the first metallic pillar includes a trapezoid portion and a stem portion connected to the trapezoid portion, and the stem portion is disposed between the trapezoid portion and the conductive features and extends into the etch stop layer.

19. The structure of claim 17, wherein at least one first metallic pillar of the capacitor structures has round corners.

20. The structure of claim 17, wherein the second metallic material layer is electrically connected with the first metallic pillars and the first metallic material layer, and the first metallic material layer, the second metallic material layer and the first metallic pillars are made of different materials.

* * * * *